United States Patent
Sato et al.

[11] Patent Number: 5,923,237
[45] Date of Patent: Jul. 13, 1999

[54] WIREWOUND-CHIP BALUN TRANSFORMER

[75] Inventors: Kouki Sato; Katsumi Saito, both of Akita-ken, Japan

[73] Assignee: TDK Corporation, Tokyo, Japan

[21] Appl. No.: 09/074,322

[22] Filed: May 7, 1998

[30]    Foreign Application Priority Data

May 23, 1997 [JP] Japan .................................... 9-148490

[51] Int. Cl.$^6$ ...................................................... H01F 27/24
[52] U.S. Cl. .............................. 336/212; 336/83; 336/192
[58] Field of Search ................................. 336/83, 192, 212

[56]    References Cited

U.S. PATENT DOCUMENTS 3,391,366   7/1968   Etal ........................................ 336/212

FOREIGN PATENT DOCUMENTS

| | | |
|---|---|---|
| 57-048216 | 3/1982 | Japan . |
| 61-208913 | 9/1986 | Japan . |
| 62-90911 | 4/1987 | Japan . |

*Primary Examiner*—Michael L. Gellner
*Assistant Examiner*—Tuyen T. Nguyen
*Attorney, Agent, or Firm*—Wood, Phillips, VanSanten, Clark & Mortimer

[57]    ABSTRACT

A wirewound balun transformer for planar packaging comprising a flanged core which has end flanges at both ends, at least one center flange, and two or more winding recesses, a flat core held in parallel with the flanged core, and windings coiled around the winding recesses, characterized in that one side face of the center flange is not flush with but is formed behind the plane that connects one side faces on the same side of the end flanges, each of the end flanges of the flanged core has an opposing pair of electrodes formed on both side faces, and the center flange has a single electrode formed on the opposite side face.

7 Claims, 9 Drawing Sheets

WIREWOUND-CHIP BALUN TRANSFORMER

BACKGROUND OF THE INVENTION

1. Field of the Invention

This invention relates to an electronic component and, more particularly, to a component (balun transformer) chiefly designed to connect different electronic circuits, couple an unbalanced circuit to a balanced, and match the impedance between circuits.

2. Description of the Prior Art

As components for use in connecting electronic circuits and intended for functions such as the coupling of unbalanced and balanced circuits and impedance matching between circuits, balun transformers are known which comprise a core with flanges that define at least two recesses in between on which conductors are wound, and terminal pins set in throughholes formed in the flanges.

In FIG. 1 is shown an embodiment of such a balun transformer described in Japanese Patent Application Kokai No. 61-208913. Two conductors are wound into coils on two recesses of a flanged ferrite core 2. The flanges of the core 2 have a vertically formed throughhole each, and a total of three terminal pins 4 are inserted through the holes and fixed securely in position. Lead-out conductor ends are suitably bound around upwardly projecting ends 3 of the pins and soldered in place for connection so as to constitute a circuit similar to the equivalent circuit depicted in FIG. 11. Each winding 1 comprises, in the equivalent circuit of FIG. 11, conductors 8, 9 wound on one recess and conductors 10, 11 on the other recess. In the illustrated example the flanged core facilitates the winding operation and permits precise control of winding length, thus making it possible to avoid the dispersion of characteristic impedance. In addition, the pins 4 can be utilized for enhancing the wiring and soldering efficiencies.

FIGS. 2 and 3 illustrate an improved construction of the balun transformer of FIG. 1, disclosed in Patent Application Kokai No. 62-90911. A bar-shaped ferrite core 5 is located in contact with the flanges of a flanged core 2. The protruding ends 3 of the pins 4 are inserted into throughholes 6 also formed in the core 5, and lead-out ends of the windings are suitably bound around the further protruding ends 3 of the pins and soldered in place to provide a circuit like the one shown in FIG. 11. The cited example has further advantages that its closed magnetic circuit structure strengthens the magnetic coupling between the windings and keeps off electromagnetic influences from the outside.

It is common with the prior art devices briefly outlined above that their flanges have throughholes in which pins are set securely and the ends of windings are bound around the ends of the pins protruding from the holes as terminal pins. The structure requires intricate molds to form holes through the ferrite core and bar-shaped ferrite core alike. This, in turn, increases the part dimensions and defies efforts to decrease the number of component parts, thus weakening the competition of the product in the market.

With the spread of electronic equipment and the tendency toward miniaturization of the parts, even smaller components for planar packaging have become essential for mobile communication. In the art of communication the transmission characteristic is an important factor that governs the performance of an equipment, since it can have adverse effects upon the communication sensitivity. The present state of the components is that their characteristic has contradictory aspects. If a better characteristic is sought the component size must be larger, and if a smaller component is desired its characteristic has to be sacrificed accordingly. The balun transformer is no exception to this contradictory state. In the fields where equipment size is a major commercial consideration, small components are in wide use at the expense of characteristic.

SUMMARY OF THE INVENTION

The present invention is aimed at providing a balun transformer which permits easy mold making, reduction of component size, and a decrease in the number of constituent members, without deterioration of the characteristic.

To achieve the aim of the invention, the product of the invention is characterized by core configurations suited for high characteristic winding, elimination of the usual members for arranging and fixing the ends of windings that have hitherto hindered the miniaturization and reduction in height of parts, and formation of end joints on side faces of a flanged core.

In brief, the invention provides a wirewound balun transformer for planar packaging comprising a flanged core which has end flanges at both ends, at least one center flange, and two or more winding recesses, a flat core held in parallel with the flanged core, and windings coiled around the winding recesses, characterized in that one side face of the center flange is not flush with but is formed behind the plane that connects one side faces on the same side of the end flanges, each of the end flanges of the flanged core has an opposing pair of electrodes formed on both side faces, and the center flange has a single electrode formed on the opposite side face.

DETAILED DESCRIPTION OF THE PREFERRED EMBODIMENTS

Some embodiments of the wirewound-chip balun transformer for planar packaging of the above construction according to the invention will now be described.

One side face of the center flange desirably is flush with the faces on the same side of the winding recesses of the flanged core.

The connection of the ends of the windings desirably is done at the positions of the electrodes on the flange side faces substantially perpendicular to the surface on which the component is to be mounted.

In another preferred embodiment, the surfaces of the flanged core and flat core to be joined together are rounded off to take in a resin (UV resin) coating and keep it from protruding outward.

The windings desirably are resin coated after they have been secured onto the winding recesses.

Also, preferably the ends of the windings are held in place in contact with the winding regions and then soldered to the electrodes. This prevents the application of stresses by external forces or the like to the ends of the windings.

Further, all edges of the flanged core are rounded off to protect them against chipping by external forces and against unwanted changes in characteristic due to such chipping.

The present invention makes possible the automatization of the winding operation, thereby improving the productivity and bringing a cost advantage. The ends of the windings are directly connected to the flange side faces that are common with external electrodes to be mounted together and are perpendicular to the surface on which they are mounted. The arrangement can dispense with conventional terminal pins for winding ends and reduce the component volume to a minimum that satisfies the characteristic requirements. The elimination of members such as terminal pins is also beneficial because it saves the production cost.

One side face of the center flange is not flush with but is formed behind the plane that connects one side faces on the same side of the end flanges. This facilitates the printing of electrodes only on the desired side faces by screen printing or other technique. Also, because the individual electrode regions in the finished product are discretely defined, the ends of the windings are easily secured in place.

The invention will be more fully described below with reference to the following examples.

Figure 4:
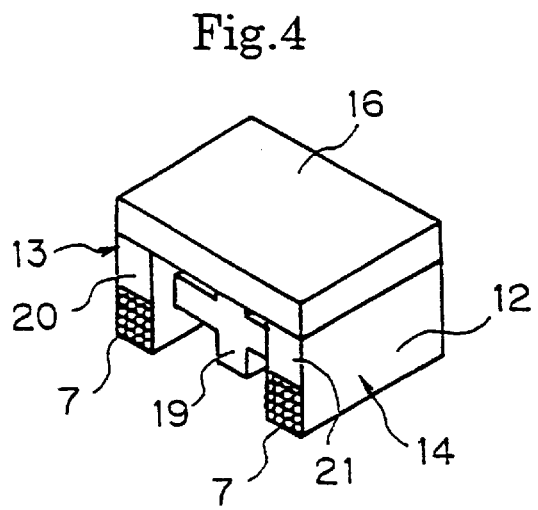
FIG. 4 is a perspective view as seen from one side of a balun transformer according to the present invention, with windings omitted.
Figure 5:
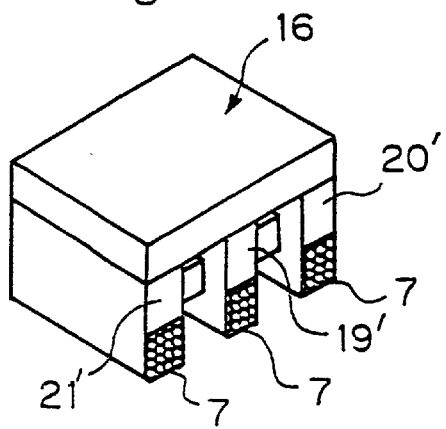
FIG. 5 is a perspective view as seen from the opposite side of the balun transformer of the invention, with windings omitted.

FIGS. 4 and 5 are perspective views of a balun transformer for planar packaging according to the present invention, with the windings omitted. The transformer comprises a flanged core 12 made of sintered ferrite and a flat core 16 also made of sintered ferrite, the two cores being joined together. FIG. 4 is a perspective view as seen from one side and FIG. 5, as seen from the opposite side.

Figure 6:
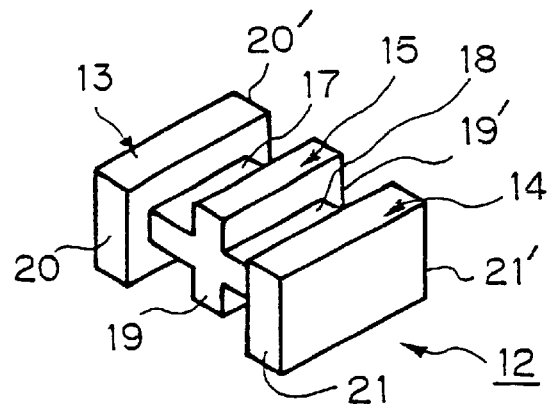
FIG. 6 is a perspective view of the flanged core of the balun transformer according to the invention.
Figure 7:
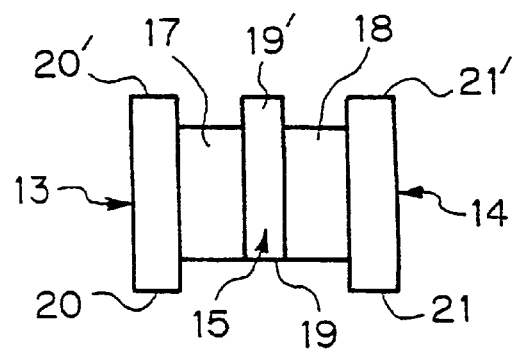
FIG. 7 is a plan view of the flanged core shown in FIG. 6.
Figure 8:
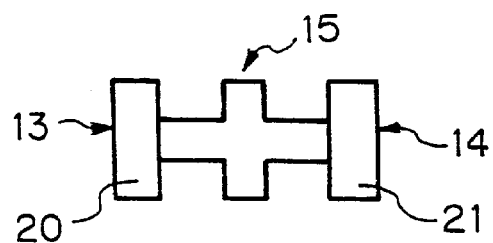
FIG. 8 is a view on one side of the flanged core of FIG. 6.
Figure 9:
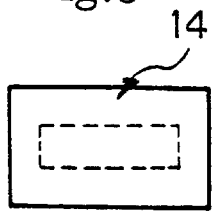
FIG. 9 is a right end view of the flanged core of FIG. 6.
Figure 10:
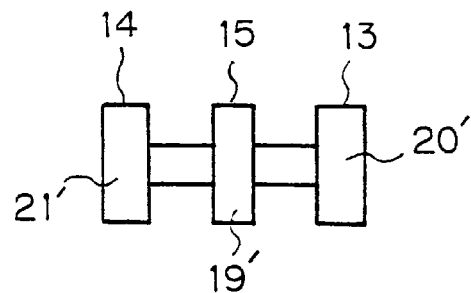
FIG. 10 is a view on the opposite side of the flanged core of FIG. 6.

Details of the flanged core 12 are shown in FIGS. 6 to 10. FIG. 6 shows the core, in perspective, as seen from the same side as FIG. 4. FIG. 7 is a plan view, FIG. 8 is a side view as seen from the same side as FIG. 4, FIG. 9 is a right end view, and FIG. 10 is an opposite side view as seen from the side of FIG. 5. Throughout these figures the flanged core 12 has a generally rectangular shape, with the same quadrilateral end flanges 13, 14 at both ends and a center flange 15 in between. Winding recesses 17, 18 are defined between the end flanges 13, 14 and the center flange 15. The core portions surrounded by the bottoms of the winding recesses 17, 18 are the portions on which conductors are to be wound. The side face 19 on the side of the center flange 15 shown in FIGS. 4 and 6 is flush with the core portions to be wire-wound. The side face 19 is preferably back a short distance toward the core portions from the side faces 20, 21 on the same side of the end flanges 13, 14, respectively. The side faces 20', 21' on the opposite side of the end flanges 13, 14 and the side face 19' on the opposite side of the center flange 15 are on the same plane as in FIGS. 5 and 7. All bottom faces of the end flanges 13, 14 and the center flange 15 are on the same horizontal plane to ensure stabilized planar packaging. Similarly the top faces of the end flanges 13, 14 and the center flange 15 are on a common horizontal plane so as to be in contact with the corresponding surface of the flat core 16 to form a closed magnetic circuit. All core edges may be rounded off to prevent the breaking of conductors.

Next, as the electrodes to which the ends of windings are attached and which permit connection to external wirings at the time of packaging, electrodes 7 are provided on the side faces 20, 20' and opposite side faces 21, 21' of the both end flanges 13, 14. At the same time, a single electrode 7 is provided on the opposite side face 19' of the center flange 15. These electrodes are formed flat on the side faces of the flanges, preferably from each side face down to the bottom face substantially perpendicular to the side face. To reduce the height of the component, it is advisable to use positively the electrodes on the vertical plane when joining to a printed circuit board or the like by soldering or other technique. The electrode portions at the bottom is not so important then and they may or may not be utilized. The electrodes are made from a highly heat-resisting material which does not hamper packaging.

Figure 11:
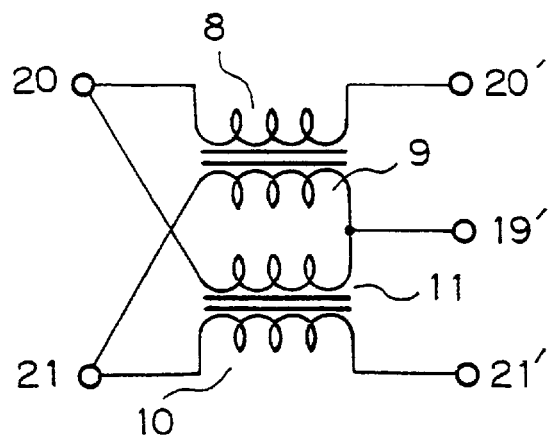
FIG. 11 is an equivalent circuit diagram of a balun transformer according to the present invention.
Figure 12:
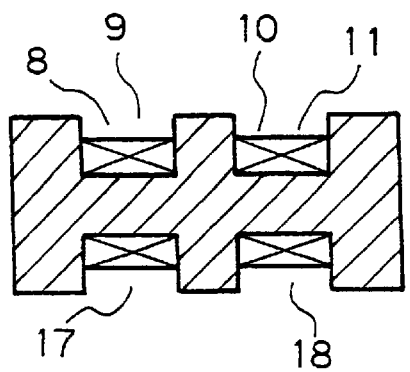
FIG. 12 is a view explanatory of windings according to the invention.

Subsequent wiring and connections as desired complete a wirewound-chip balun transformer, whose equivalent circuit is shown in FIG. 11. The construction of the circuit itself is known in the art. As FIG. 12 indicates, windings 8, 9 are applied together to the winding recess 17 shown in FIGS. 7 to 10 and windings 10, 11 to the winding recess 18, and then the ends 22 of the windings are soldered to the electrodes on the side faces 20, 21, 19', 20', 21' as illustrated in FIG. 11.

A typical winding procedure is as follows. Two conductors are used to form four coils by twice-winding operation. To begin with, the two conductors are turned counterclockwise round the winding recess 17 from the side face 19 of the center flange 15 outward. Next, one of the conductors is temporarily fixed at the end to another object. The other conductor is then turned back from the side face 19' of the center flange 15 and is again arranged in parallel with the former conductor. From that point the two conductors are turned together clockwise on the other winding recess 18. A total of four coils are formed this way. Finally, the ends 22 of the windings are separated and soldered securely to the corresponding electrodes to constitute the circuit of FIG. 11. The winding structure thus obtained and the connections of the winding ends 22 to the electrodes 7 are shown in FIGS. 18 to 22.

Figure 13:
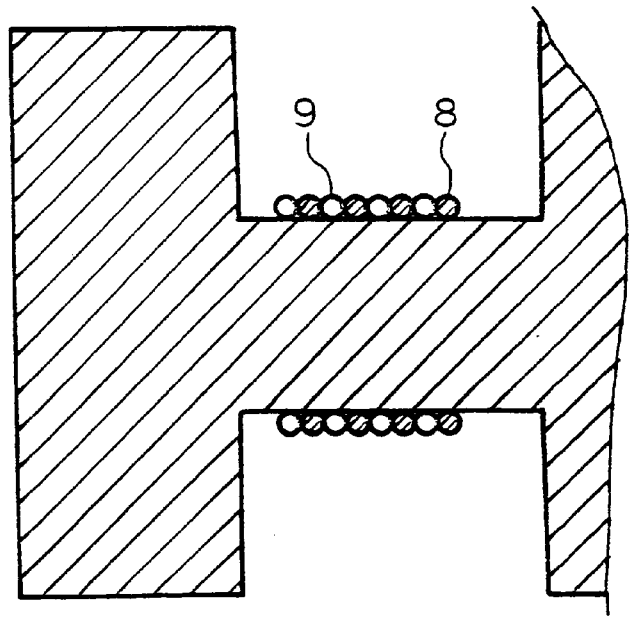
FIG. 13 is an example of tight winding recommended by the invention.
Figure 14:
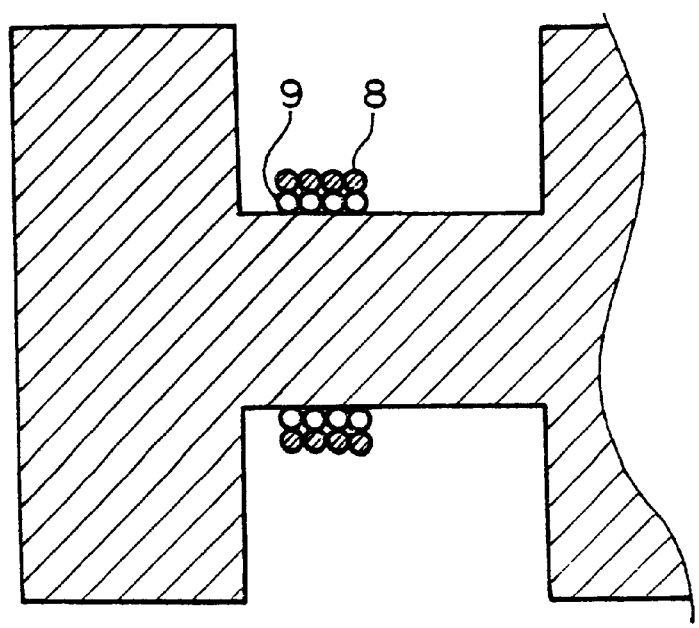
FIG. 14 is another example of tight winding recommended by the invention.

FIG. 13 exemplifies a state of windings. The winding 8 (represented by black circles) and the winding 9 (white circles) coexist on a single recess. To strengthen the conductor coupling, the conductors 8, 9 are alternately turned close to each other in tight winding. For this purpose it is desirable to use a winding method suited for tight winding, such as spindle winding or flier winding. FIG. 14 shows another state, in a cross section, of windings crossed partly as a result of flier winding, in which the core on which the conductors are wound does not rotate but winding nozzles not shown revolve around the core. Here again the windings 8, 9 produce good conductor coupling although they form superposed layers.

Figure 15:
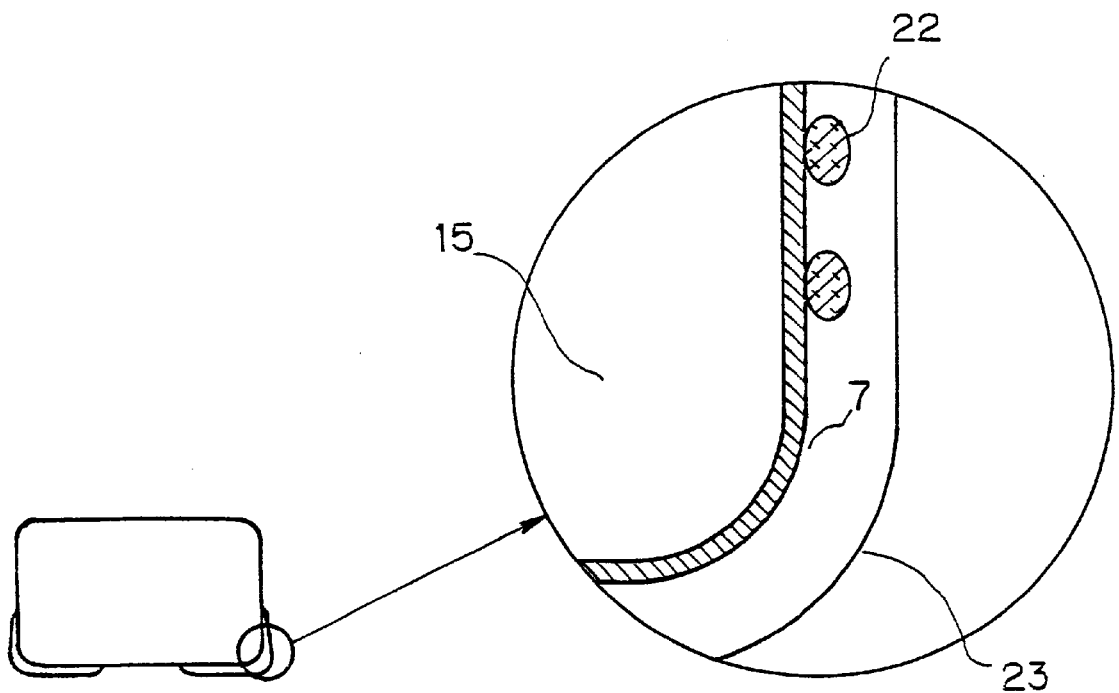
FIG. 15 is an exemplary view of winding end treatment, with partial enlargement.

FIG. 15 shows how winding ends 22 and an external electrode 7 are joined together. Joints are located on the substantially vertical flange side faces 20, 21 and 19', 20', 21'. For the connection of the external electrode 7 and winding ends 22, the insulating film that covers the winding material is preliminarily torn by the weight and heat applied as they are temporarily fixed at the joining points. The insulating film is completely removed by heating at a temperature not high enough to deteriorate the film. The winding ends 22 and each terminal electrode 7 are electrically connected by a solder layer 23 formed of fluid solder as in FIG. 15. The heating method is desirably such that it generates a temperature stable with respect to a preset temperature.

Figure 16:
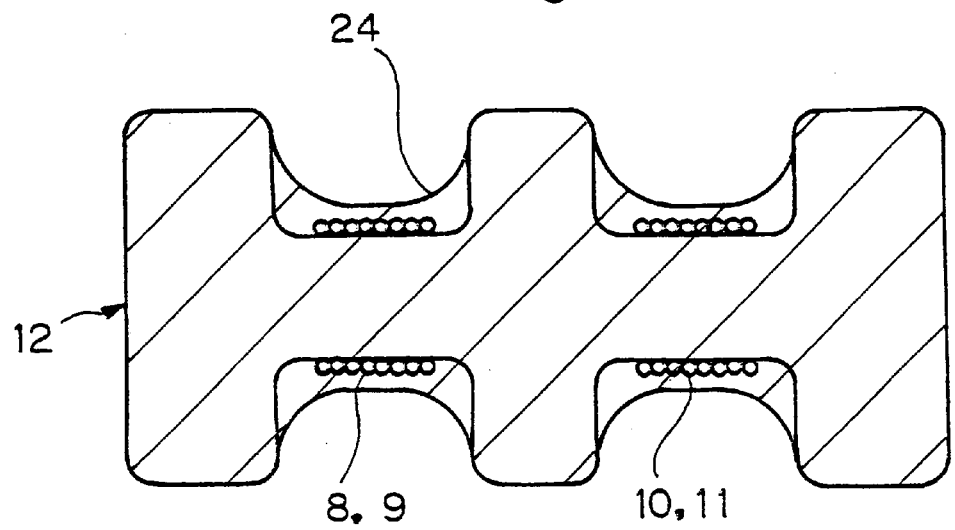
FIG. 16 is a view of windings coated with an impregnating material.

FIG. 16 shows an impregnating resin coating 24 provided to enhance the environmental resistance of the windings 8, 9, 10, 11. The impregnation coating desirably is done using a mechanism capable of applying the resin at a uniformly controlled rate. The permeability of the impregnating material is improved by maintaining either the wirewound flanged core 12 or the impregnating material at a suitable temperature. It is also advisable that the material possesses environmental resistance and good workability for production.

Figure 17:
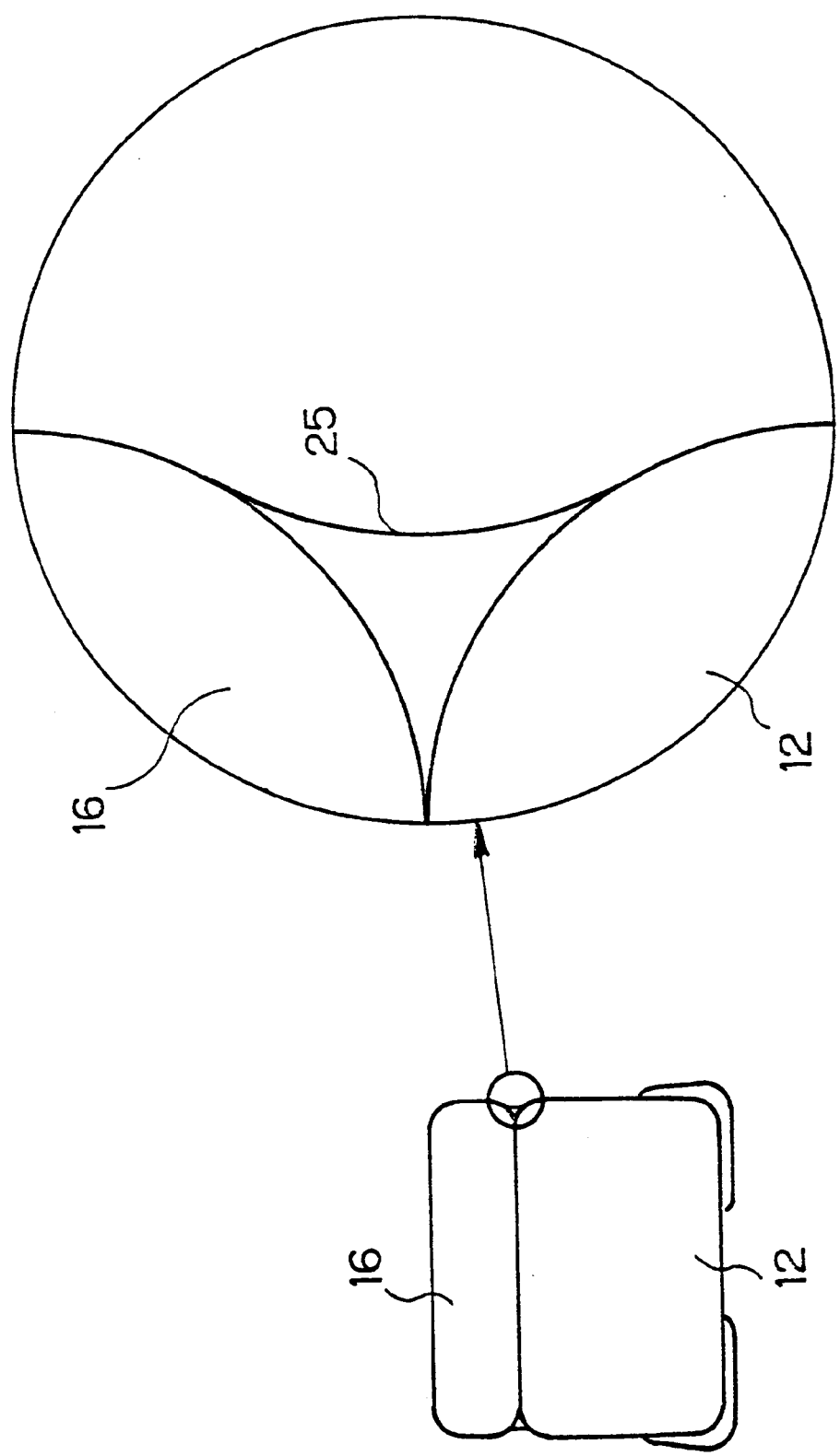
FIG. 17 is a view of a flanged core and a flat core joined together.
Figure 18:
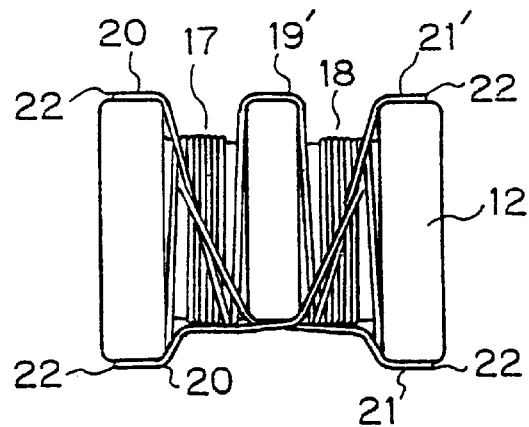
FIG. 18 is a plan view of a flanged core with windings according to the invention.
Figure 19:
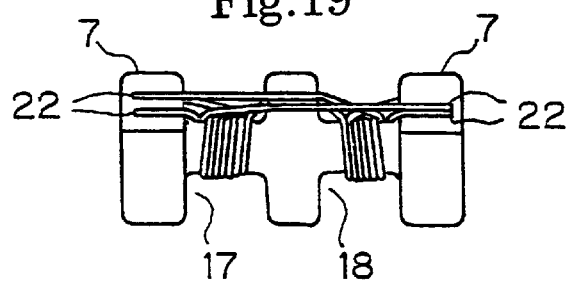
FIG. 19 is a side view of the flanged core with windings according to the invention.
Figure 20:
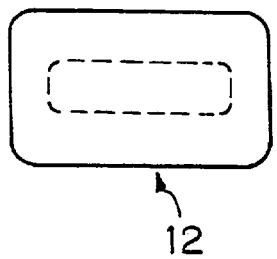
FIG. 20 is an end view of the flanged core with windings according to the invention.
Figure 21:
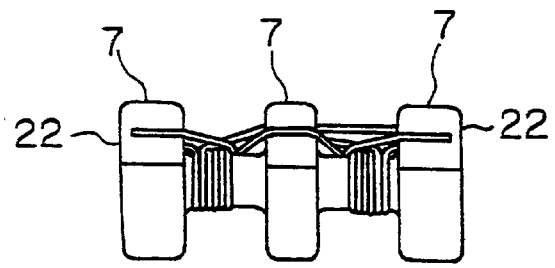
FIG. 21 is a view of the opposite side of the flanged core with windings according to the invention.

FIG. 17 shows a joint formed between a flat core and a flanged core. An adequate amount of adhesive is applied to the surface portions to be joined, and the flat core 16 and the flanged core 12 are joined together. For the joining purpose a material curable in a short time, such as UV-cured resin 25, is used. With the application of a weight, the UV resin that has been forced upward along the interface for joining is irradiated with ultraviolet rays for preliminary curing. The resin is then permanently cured to maintain the joint strength. The materials to be joined are desirably chosen in consideration of their physical strength and environmental resistance.

As referred to above, FIGS. 18 to 22 depict the particulars of windings on a flanged core. The procedure has already been explained in detail. All edges of the flanged core 12 are rounded off to make the core surface edgeless. This adds to the durability of the windings against the breaking under tension of winding operation and against the tear of the insulating film. Rounding the core edges off is suitably done by sandblasting or other process that treats small, complex-shaped objects or by removing sharp edges from the mold cavity for the core.

The winding procedure so far described can form four coils by a sequence of only two winding cycles, achieving high production efficiency.

Figure 22:
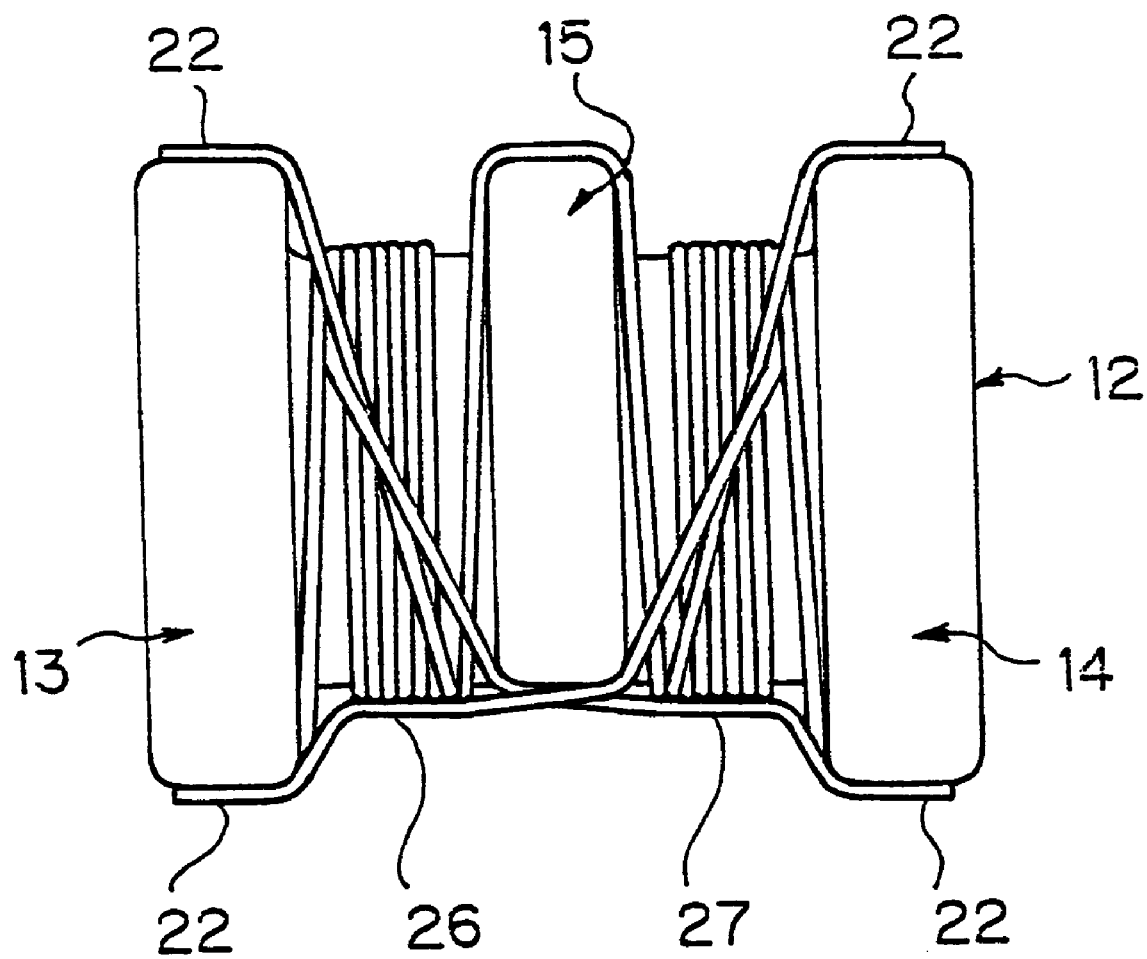
FIG. 22 is a view illustrating how the ends of windings are secured in position in accordance with the invention.

FIG. 22 shows how crossing winding ends are neatly arranged and finished. Crossing lead-out conductor portions 26, 27 that continue to the winding ends 22 are held in tight contact with the facing coil portions. The arrangement eliminates any conductor portion that connects the edges of the flanged core 12 in a straight line, removes tensile stresses, and makes the lead-out portions continuous to the winding ends 22 more resistant to impact and conductor breaking.

The present invention permits automatization of the winding operation and enhances the productivity to an economic advantage. The ends of the windings are directly connected to the flange side faces that are common with external electrodes to be mounted together and are perpendicular to the surface on which they are mounted. The arrangement renders it possible to dispense with conventional terminal pins for winding ends and reduce the component volume to a minimum that satisfies the characteristic requirements. The elimination of members such as terminal pins is beneficial from the viewpoint of production cost. The electrodes in the planes flush with the vertical flange side faces and bottom faces can be easily fabricated by screen printing. They thus lend themselves to quantity production at low manufacturing cost. The individual electrode regions are discretely defined by the side faces of the flanges, and therefore the ends of the windings are easily secured in place. Moreover, the coating of the conductors with an impregnating material improves the environmental resistance of the component.

Figure 1:
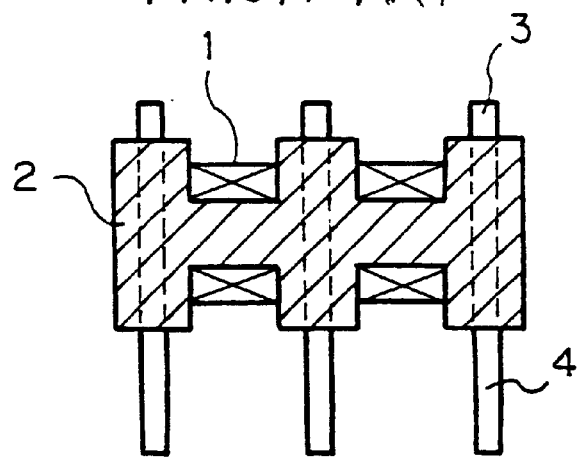
FIG. 1 is a view of an example of conventional balun transformers.
Figure 2:
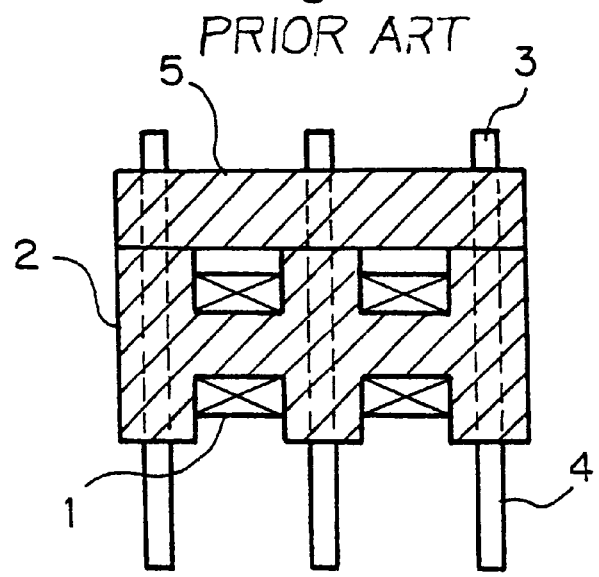
FIG. 2 is a view of another example of conventional balun transformer.
Figure 3:
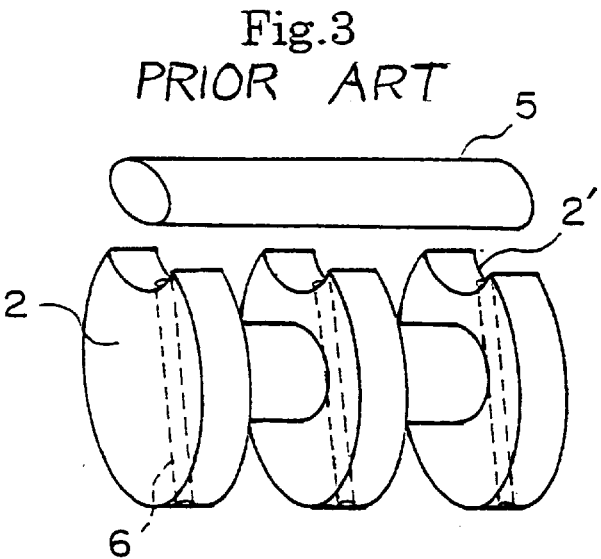
FIG. 3 is a view of the core structure of another example of conventional balun transformer.

With configurations free from irregularities on the joining faces the flanged and flat cores can be joined flush with each other. The configurations help mechanize the joining process, with a joint precision as high as the designed precision of the machine. When the core configurations make use of conventional locating pin holes 6 and arcuate recesses 2' as in FIG. 3, the locating accuracy must be set to an adequately high level.

The core shapes illustrated in FIGS. 4 to 10 are superior in high frequency characteristics to the currently dominant core shapes.

The flat core shown in FIGS. 4 and 5 provide the surface against which the suction cup of a packaging unit is to be pressed, thus making automatic packaging possible.

The joint position shown in FIG. 15 is the lowest of the positions where the ends of windings can be connected to the electrodes on the flanges.

What is claimed is:

1. A wirewound balun transformer for planar packaging comprising a flanged core which has end flanges at both ends, at least one center flange, and two or more winding recesses, a flat core held in parallel with the flanged core, and windings coiled around the winding recesses, characterized in that one side face of the center flange is not flush with but is formed behind the plane that connects one side face on the same side of the end flanges, each of the end flanges of the flanged core has an opposing pair of electrodes formed on both side faces, and the center flange has a single electrode formed on the opposite side face.

2. The transformer of claim 1, wherein said one side face of the center flange is flush with the faces on the same side of the winding recesses of the flanged core.

3. The transformer of claim 1 or 2, wherein the connection of the ends of said windings is done at the positions of said electrodes on the flange side faces substantially perpendicular to the surface on which the component is to be mounted.

4. The transformer of claim 1, or 2, wherein the surfaces of the flanged core and flat core to be joined together are flat.

5. The transformer of any of claim 1 to 2, wherein the windings only are coated with a resin.

6. The transformer of any of claim 1 to 2, wherein the ends of the windings are held in place in contact with the winding regions and then soldered to the electrodes.

7. The transformer of any of claim 1 to 2, wherein all edges of the flanged core are rounded off.

* * * * *